(12) United States Patent
Stefanov

(10) Patent No.: US 7,431,481 B2
(45) Date of Patent: Oct. 7, 2008

(54) MODULAR SURFACE LIGHT GUIDE

(76) Inventor: Emil Stefanov, Julius-Motteler-Str. 5, Esslingen (DE) 73728

( * ) Notice: Subject to any disclaimer, the term of this patent is extended or adjusted under 35 U.S.C. 154(b) by 78 days.

(21) Appl. No.: 11/337,354

(22) Filed: Jan. 23, 2006

(65) Prior Publication Data

US 2006/0164839 A1 Jul. 27, 2006

(30) Foreign Application Priority Data

Jan. 24, 2005 (DE) .................. 10 2005 003 367

(51) Int. Cl.
*F21V 5/00* (2006.01)
*F21V 7/04* (2006.01)

(52) U.S. Cl. .................. 362/328; 362/327; 362/610; 362/616

(58) Field of Classification Search .................. 362/297, 362/327, 328, 330, 332, 339, 346, 608, 609, 362/610, 615, 621, 623, 625, 626, 628, 308, 362/309

See application file for complete search history.

(56) References Cited

U.S. PATENT DOCUMENTS

| 5,707,130 | A | | 1/1998 | Zwick et al. | |
|---|---|---|---|---|---|
| 5,890,796 | A | * | 4/1999 | Marinelli et al. | 362/615 |
| 6,953,271 | B2 | * | 10/2005 | Aynie et al. | 362/327 |
| 7,134,768 | B2 | * | 11/2006 | Suzuki | 362/332 |
| 7,195,375 | B2 | * | 3/2007 | Jain | 362/346 |

* cited by examiner

*Primary Examiner*—Y My Quach Lee
(74) *Attorney, Agent, or Firm*—Reising Ethington Barnes Kisselle, P.C.

(57) ABSTRACT

A light guide assembly includes a base and a light source that are removably secured to the base. The light source is oriented to emit light out and away from the base. A light distributor is spaced apart from the light source and distributes the light across the light guide assembly. The light distributor includes a primary reflection surface with a plurality of transmission elements extending out from the primary reflection surface therealong to allow a portion of the light to pass through the transmission elements of the primary reflection surface without being reflected by the primary reflection surface. This facilitates the creation of a uniform beam of light being emitted by the light guide assembly.

6 Claims, 6 Drawing Sheets

MODULAR SURFACE LIGHT GUIDE

BACKGROUND ART

1. Field of the Invention

The invention relates to a light guide assembly. More particularly, the invention relates to a light guide assembly that disperses light in a uniform manner across an entire lens through which light is emitted.

2. Description of the Related Art

Light guide or emitting devices are known. EP 0 780 265 B1 discloses a light-emitting unit. To the observer of the light guide device described in this disclosure, the central area of the light guide device appears dark.

SUMMARY OF THE INVENTION

A light guide assembly includes a base and a light source removably secured to the base. The light source is oriented to emit light out and away from the base. The light guide assembly also includes a light distributor spaced apart from said light source for distributing the light across the light guide assembly. The light distributor includes a primary reflection surface with a plurality of transmission elements extending out from the primary reflection surface therealong to allow a portion of the light to pass through the transmission elements of the primary reflection surface without being reflected by the primary reflection surface.

BRIEF DESCRIPTION OF THE DRAWINGS

Advantages of the invention will be readily appreciated as the same becomes better understood by reference to the following detailed description when considered in connection with the accompanying drawings, wherein.

DETAILED DESCRIPTION OF THE PREFERRED EMBODIMENT

Figure 1:
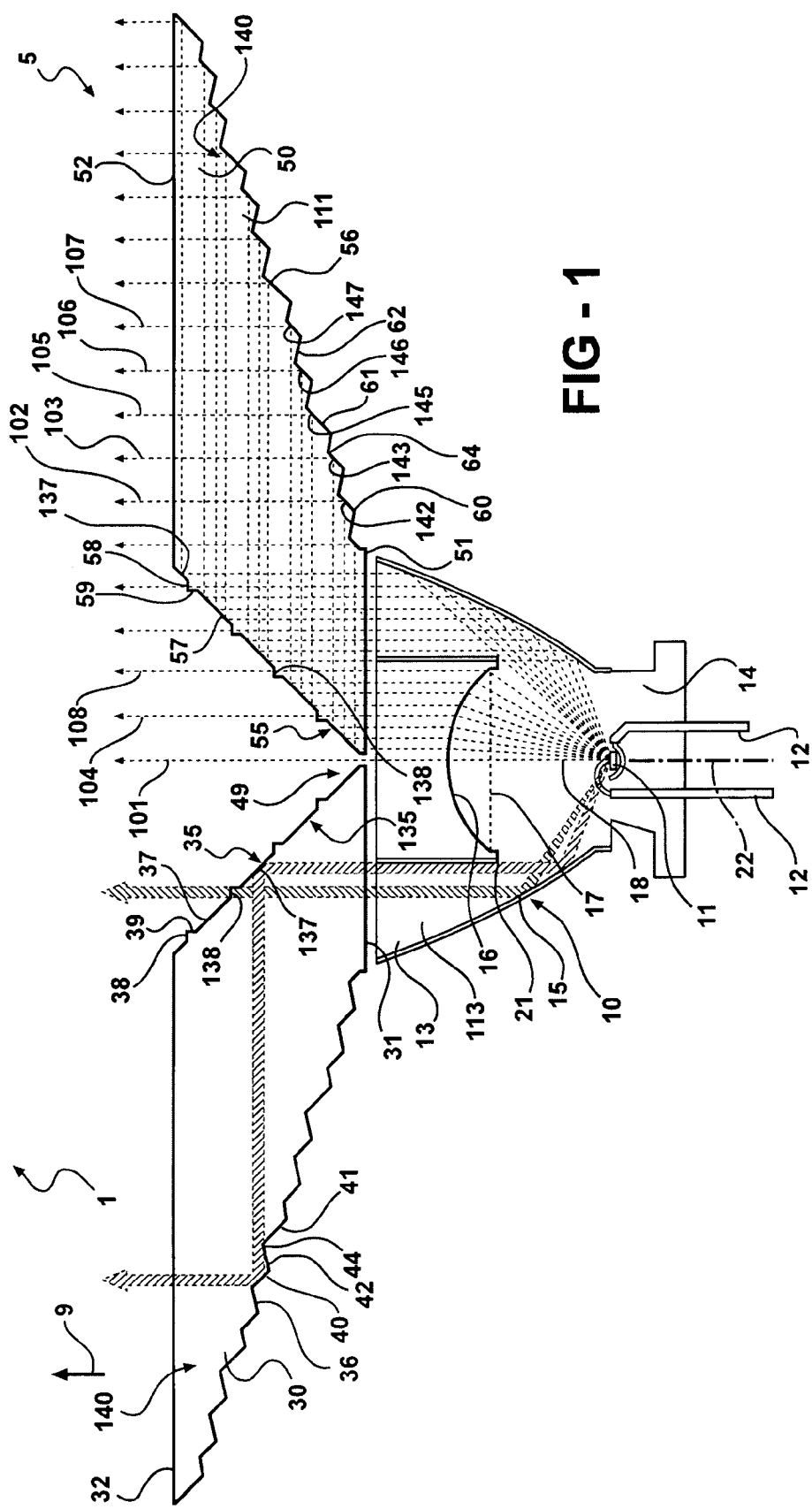
FIG. 1 is a cross-sectional side view of one embodiment of the invention with a light source emitting light.
Figure 2:
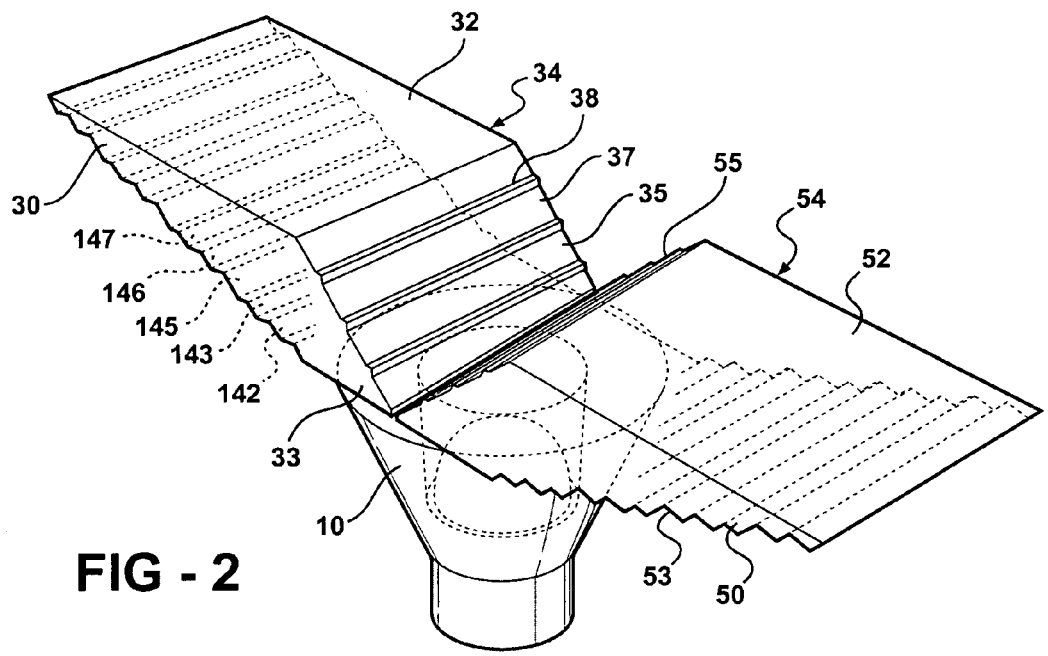
FIG. 2 is a perspective view of a the invention with the surface light guide removed.
Figure 3:
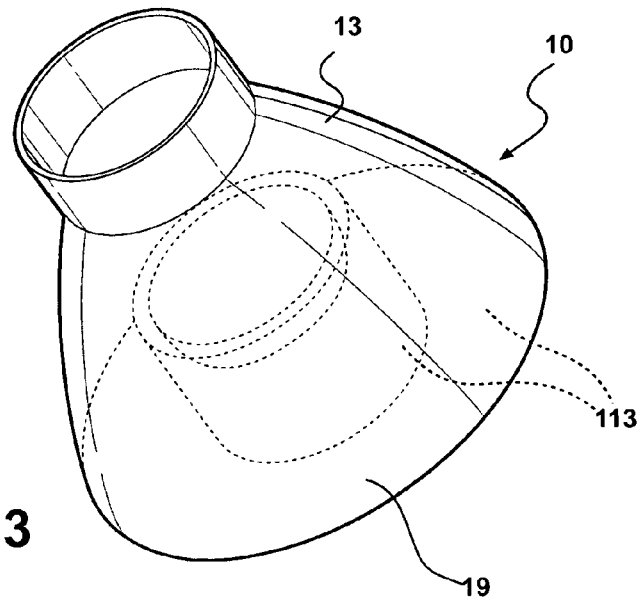
FIG. 3 is a perspective view of a collimator incorporated into the invention.

FIG. 1 shows a section through a light guide assembly or light-emitting unit 5 with a light source 10 and with two light distributors 30; 50. This light guide assembly 5 is, for example, a part of a motor vehicle's combined rear light unit not represented in more detail in this Figure. In FIG. 2, this light guide assembly 5 is represented in a perspective view. And, in FIG. 3, a perspective view of the collimator 113 surrounding the light source 10 of this light guide assembly 5 is represented.

The light source 10 is, for example, a light-emitting diode or luminescence diode 10. It includes a light-emitting chip 11 with electrical connections 12 and a light-deflecting element 13. The light-deflecting element 13 is, for example, a transparent, light-refracting element. The material of the light-deflecting element 13 is, for example, a thermoplastic plastic, e.g. PMMA, PMMI, etc., or glass. The light-deflecting element 13 consists, for example, of a base 14 and of a parabolic shell 15 at whose focal point, for example, the light-emitting chip 11 is located. The parabolic shell 15 has a plane, circular light exit surface 19 which is normal to the optical axis 22 of the light source 10. The circular light exit surface 19 encircles a second light exit surface 16 set lower in the parabolic shell 15. This is, for example, a converging, optical lens 16. It can, for example, be embodied as a Fresnel lens. Around the optical lens 16 there is a chamfer 21. The distance from the base plane 17 of the optical lens 16 to the light-emitting chip 11 is greater than the focal length of the optical lens 16. This distance corresponds approximately to one half of the length of the light-deflecting element 13 between the light-emitting chip 11 and the light exit surface 19 of the light-emitting diode 10. In this embodiment, the outer diameter of the light exit surface 19, e.g. 9 mm, is twice as large as the outer diameter of the chamfer 21.

The two light distributors 30; 50 are elements which are disposed so as to be axially symmetric to the optical axis 22 of the light source 10 and each of whose cross section represented in FIG. 1 has at least approximately the form of a trapezoid. The two light distributors 30; 50 each have a light entry surface 31; 51 and a light exit surface 32; 52. Here the surfaces 31, 32; 51, 52 are parallel to one another. They are furthermore parallel to the light exit surface 19 of the light source 10. With respect to the light entry surfaces 31; 51, the light exit surfaces 32; 52 are each offset from the optical axis 22 toward the outside by approximately 25% of the length of the individual light distributor 30; 50. The length of the light entry surfaces 31; 51 of the individual light distributor 30; 50 in the representation of FIG. 1 in the direction transverse to the optical axis 22 is in the embodiment example approximately 28% of the length of this light distributor 30; 50 and the length of the light exit surfaces 32; 52 is approximately 75%. In this embodiment, the sum of the lengths of both light distributors 30; 50 is 35 mm. The height of the light distributor 30; 50 in the representation of FIGS. 1 and 2 is 26% of the length of this element 30; 50. The two side faces 33, 34; 53, 54 of each of the light distributors 30; 50 are parallel to one another.

The light distributors 30; 50 have face-side surfaces 35, 36; 55, 56 which lie opposite one another, are not parallel, have different lengths in the sectional representation of FIG. 1, and are composed of individual surface elements 37-39, 40-42; 57-59, 60-62. The respective short face-side surface 35; 55 consist of five oblique surface elements 37; 57. Disposed between those elements are an additional four surface elements 38; 58 as well as end flank surface elements 39; 59, which border the surface elements 38; 58. The surface elements 37; 57 and the light entry surface 31 are at a wedge angle of 45° to one another. The individual surface elements 37; 57 are equally large and lie in a common plane.

The surface elements 38; 58 border, for example, the respective surface element 37; 57 lying above in FIG. 1. These surface elements 38; 58 lie parallel to the light entry surface 31; 51. The individual surface elements 38; 58 are equally long. Their length is 1.4% of the length of the light distributor 30; 50. In an imaginary projection onto the light entry surfaces 31; 51, each two adjacent surface elements 38; 58 are at a distance from one another of, for example, 5.8% of the length of a light distributor 30; 50.

In the representation of FIG. 1, the surface elements 38; 58 project out from the face-side surfaces 35; 55. An end flank surface element 39; 59, which is normal to the surface element 38; 58, connects a surface element 38; 58 to an oblique surface element 37; 57 lying below.

Figure 4:
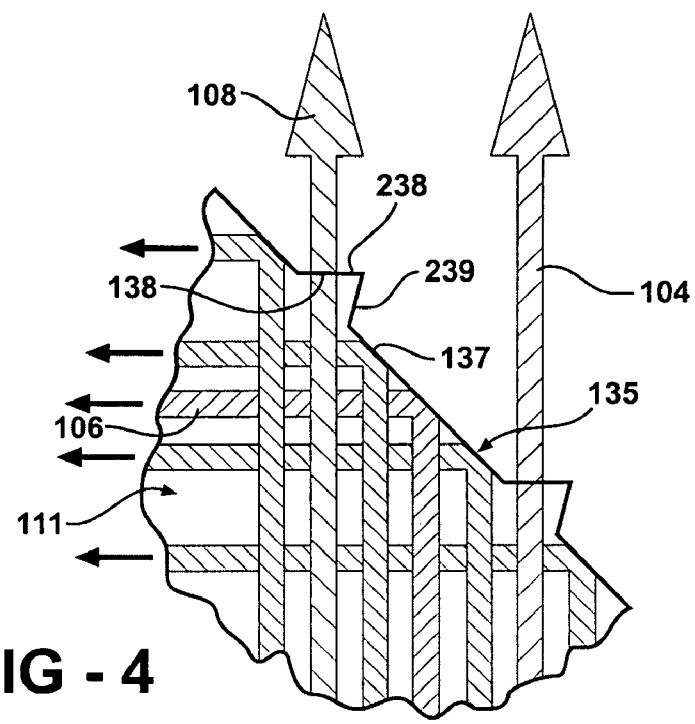
FIG. 4 is a fragmentary side view of a the light distributor with light graphically represented by arrows.
Figure 5:
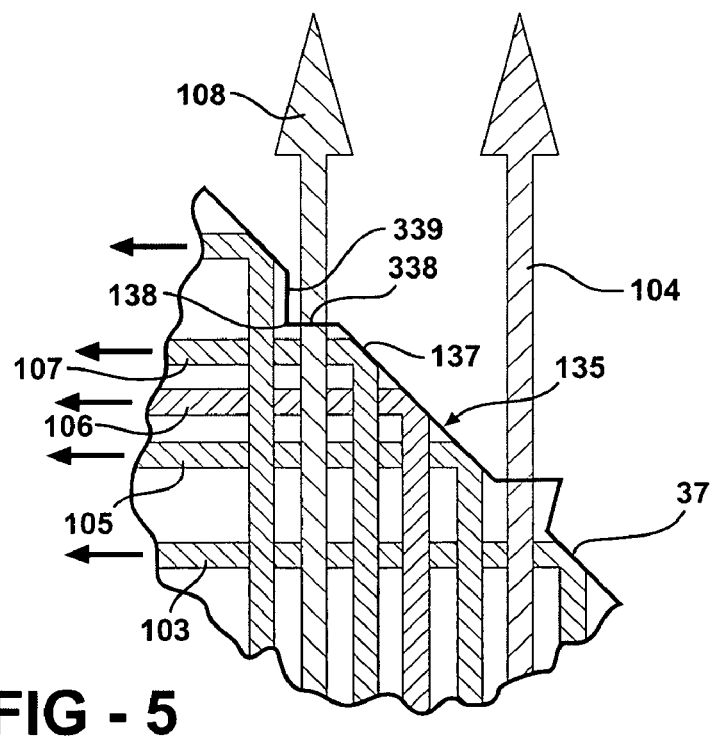
FIG. 5 is a fragmentary side view of an alternative embodiment of the light distributor with light graphically represented by arrows.

In FIGS. 4 and 5, two additional embodiment variants of the face-side surfaces 35 of a light distributor 30 are shown. In FIG. 4, the surface elements 238 are longer by 10% than the surface elements 38 represented in FIG. 1. The end flank surface elements 239 and the surface elements 238 are the boundaries of an acutely angled wedge.

FIG. 5 shows surface elements 338 which are impressed in the light distributor 30. These surface elements 338 also lie parallel to the light entry surface, not represented here, of the light distributor 30. Here, the end flank surface elements 339 each connect a surface element 338 to an oblique surface element 37 disposed above in the representation of FIG. 5.

The long face-side surfaces 36; 56 of the light distributor 30; 50 each consist of 25 disposed surface elements 40-42; 60-62 (FIGS. 1 and 2). One half 40, 41; 60, 61 of these surface elements 40-42; 60-62 are, for example, disposed in such a manner that they form a series of steps parallel to the oblique surface elements 37; 57 of the short face-side surfaces 35; 55. These surface elements 40, 41; 60, 61 are denoted in the following as step surface elements 40, 41; 60, 61. The other surface elements 42; 62, also disposed in such a manner that they form a series of steps, are end flank surface elements and connect the surface elements 40, 41; 60, 61 to one another. The end flank surface elements 42; 62 are each at an angle with a step surface element 40, 41; 60, 61 which borders it on an apical line 44; 64, said angle being, for example, less than 135°.

In an imaginary projection onto the plane of the light entry surfaces 31; 51 each two adjacent apical lines 44; 64 are, for example, at the same distance to one another.

In the light distributors 30; 50 represented in FIGS. 1 and 2, the step surface elements 40, 41; 60, 61 are of two different sizes. Thus, in FIG. 1, as measured from the light entry surface 31; 51, the fourth, the seventh, the tenth, and the thirteenth step surfaces 41; 61 are larger by 50% than the other step surfaces 40; 60. Each imaginary line parallel to the light entry surface 31; 51 in the longitudinal direction of the light distributor 30; 50 through an end flank surface element 39; 59 of the short face-side surface 35 intersects, in the embodiment example of FIG. 1, a large step surface element 41; 61 of the long face-side surface 36.

Figure 6:
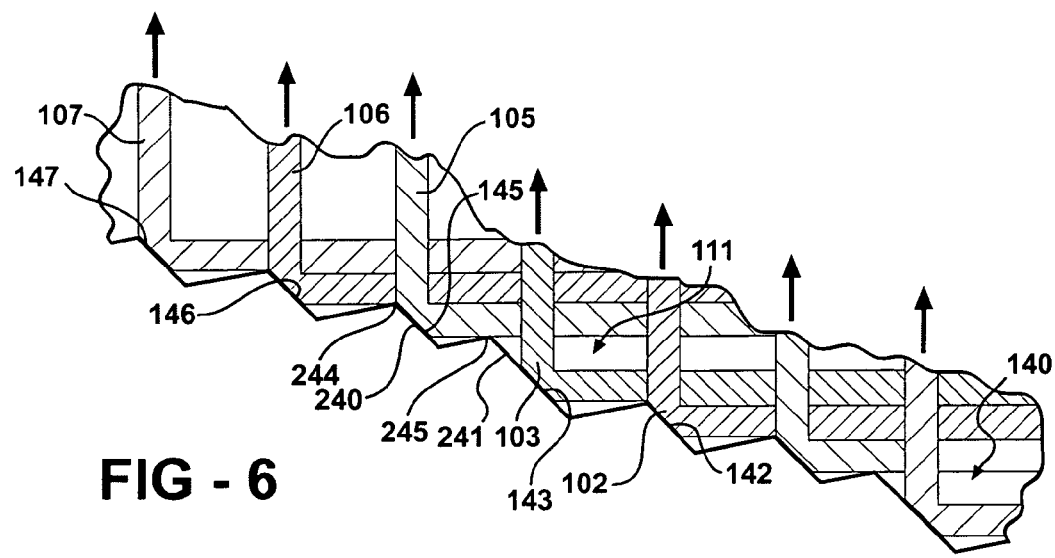
FIG. 6 is a fragmentary side view of a plurality of light deflecting surfaces with light graphically represented by arrows.
Figure 7:
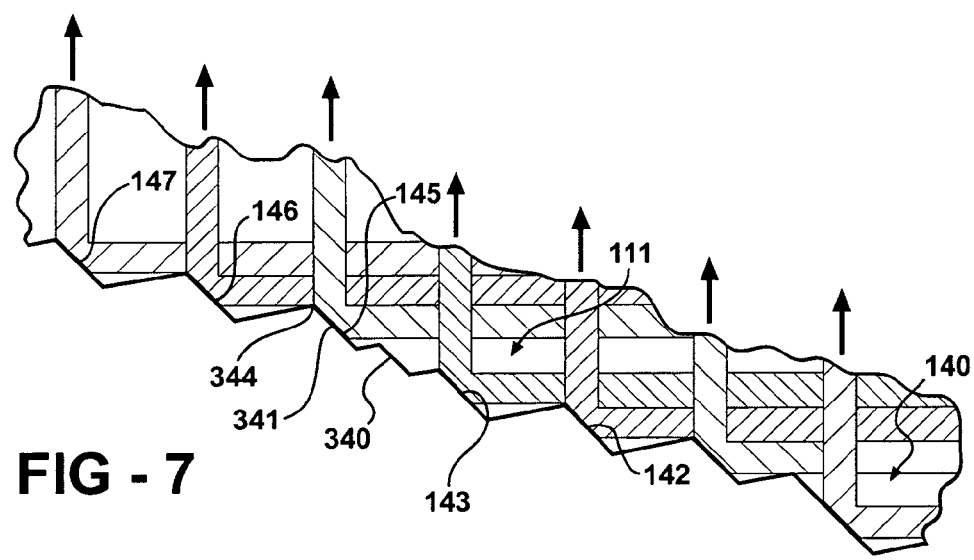
FIG. 7 is a fragmentary side view of an alternative embodiment of a plurality of light deflecting surfaces with light graphically represented by arrows.

In FIGS. 6 and 7, additional embodiments of a long face-side surface 36 are represented. The number and the angular position of the step surface elements 240, 241; 340, 341 are identical to those in the embodiment shown in FIGS. 1 and 2. In FIG. 6, the distance to the apical lines 244, 245 projected onto the plane of the light entry surface 31 is not constant. The apical lines 244 bound the small step surface elements 240. The apical lines 245 lie on the large step surface elements 241.

In this embodiment, the large step surface elements 241 are larger by 87% than the small step surface elements 240.

Also, the light distributor 30 represented in FIG. 7 has step surfaces 340, 341 of a different size. The large step surface elements 341 are 80% larger than the small step surface elements 340. All the apical lines 344 which bound a large step surface element 341 are in a projection onto the plan of the light entry surface 31 at the same distance from both adjacent apical lines 344 bordering a large step surface element 341.

The individual light distributor 30; 50 can comprise combinations of the embodiments described. Thus, it can, for example, have a short face-side surface 35; 55 according to FIG. 4 and a long face-side surface 36; 56 according to FIG. 7. Also, the face-side surfaces 35, 36; 55, 56 can have configurations differing by section.

The distance of the two light distributors 30; 50 from one another, the length of the seam 49, corresponds to the length of one of the surface elements 38; 58 represented in FIG. 1. The two light distributors 30; 50 can also be connected to one another, for example, by means of a central bar of constant thickness. Instead of two light distributors 30; 50 a single rotationally symmetric light distributor can also be used. The axis of rotation is in this case, for example, the optical axis 22 of the light source 10.

During the operation of the light guide assembly 5, light 101-108 from the light-emitting chip 11 is produced in the light source 10. A part of the light 101-108 emitted by the light-emitting chip 11 and represented in FIG. 1 as a dotted line strikes the boundary surface of the light-deflecting element 13, which is formed by the converging lens 16. The angle between the striking light and a normal at the point of incidence is less than the critical angle of total reflection. This critical angle is, in PMMA for example, 42°. The striking light passes through the converging lens, where it is refracted in the direction of the optical axis 22. The light exiting from the converging lens 16 is parallel to the optical axis 22 of the light guide assembly 5.

The part of the light 101-108 emitted by the light-emitting chip 11 which does not pass through the converging lens 16, strikes the boundary surface of the light-deflecting element 13 which is formed by the circumferential surface of the parabolic shell 15. The angle at which it strikes is greater than the critical angle of total reflection. This part of the light bundle 101-108 is completely reflected in the direction of the light exit surface 19. It passes through the light exit surface 19 in the normal direction and is also parallel to the optical axis 22 of the light source 10. The light-deflecting element 13 of the light source 10 collimates the light 101-108 emitted by the light-emitting chip 11. It thus acts as collimator 113 for the light 101-108. The direction 9 of the collimated light 101-108 emitted by the light source 10 is parallel to the optical axis 22 of the light source 10.

The collimated light 101-108 passes through the light entry surfaces 31; 51 into the light distributors 30; 50. In the light distributors 30; 50, it strikes the boundary surfaces which are formed by the short face sides 35; 55. These two boundary surfaces form a beam splitter 135 for the light bundle 101-108.

The light bundle 101-108 strikes the beam splitter 135 in the sections in which the surface elements 38; 58 represented in horizontal position in FIG. 1 are the boundaries of the respective light distributor 30; 50 as well as at the seam 49 between the light distributors 30; 50 and in the sections in which the surface elements 38; 58 which are oblique in this Figure form the boundary of the element. The light 104, 108 which strikes normal to the boundary surface in the sections 38; 58 represented in horizontal position passes through these boundary surfaces into the environment 1. The areas of these boundary surfaces illuminated by the light source 10 are light passage surfaces 138. These light passage surfaces 138 lie at least approximately normal to the direction 9 of the parallelized light 101-108. Also the seam 49 forms a light passage surface 138 through which the light bundle 101 exits into the environment 1. All the light passage surfaces 138 are, in a projection opposite the direction of the parallelized light 101-108, of the same size and in each case are at the same distance from two adjacent light passage surfaces 138.

Light bundles 102, 103, 105-107 which strike boundary surfaces formed by the oblique surface elements 37; 57 strike here at an angle to the normal to the boundary surface, said angle being greater than the critical angle of total reflection of the material of the respective light distributor 30; 50 against the ambient air 1. These boundary surfaces form the light-reflecting surfaces 137 at which the striking light 102, 103, 105-107 is deflected, for example, completely in the longitudinal direction of the respective light distributor 30; 50. After the reflection the light bundles 102, 103, 105-107 are once again parallel to one another. Between the light bundles 102, 103, 105-107 there are non-illuminated gaps 111 since the light 101, 104, 108 passing through the light passage surfaces 138 is not deflected. Boundary surfaces of the light distributors 30; 50, specifically those formed by the end flank surface elements 39, are not illuminated.

If the light distributor 30; 50 is structured as in FIGS. 4 and 5, the light 101-108 emitted by the light source 10 is split at the beam splitter section 135 shown in these Figures in a manner at least similar to that in the case of the beam splitter 135 represented in FIG. 1. In each of FIGS. 4 and 5, only the central area of the parallelized light bundles 103-108 tangential to one another is represented for the purposes of illustration. In an embodiment according to FIG. 4, the light 104, 108 passing through the light passage surfaces 138 is, due to the end flank surfaces 239, for example, not reflected or refracted. In the embodiment example according to FIG. 4, the light passage surfaces 138 are only the areas of the boundary surfaces formed by the surface elements 238 and illuminated by the light source 10.

The light bundles 102, 103, 105-107 deflected at the beam splitter 135 strike the boundary surfaces of the respective light distributor 30; 50, where said boundary surfaces are disposed in such a manner that they form a series of steps and are formed by the step surface elements 40, 41, (FIG. 1). Here these boundary surfaces are only partially illuminated. The illuminated areas are light-deflecting surfaces 142, 143, 145-147 of a light-deflecting area 140 at which the light bundles 102, 103, 105-107 are reflected in the direction of the light exit surface 32; 52. In this case, the light bundle 102 strikes, for example, the light-deflecting surface 142, the light bundle 103 strikes the light-deflecting surface 143, and the light bundle 105 strikes the light-deflecting surface 145. The latter is, for example, part of a boundary surface formed by a large step surface element 41; 61. The light bundle 103, which, for example, lies above the light bundle 102 in the representation of FIG. 1, is tangential to the light-deflecting surface 142 and strikes the light-deflecting surface 143 next further removed from the beam splitter 135. In a projection opposite to the direction of the portions of light 102, 103, 105-107 deflected at the light-deflecting surfaces 142, 143, 145-147 the distance of the light-deflecting surfaces 142, 143, 145-147 from one another is the same. In this projection this distance also corresponds to the distance of the light passage surfaces 138 from one another and from the light-deflecting surfaces 142, 143, 145-147. The surfaces 138, 142, 143, 145-147 are in the projection, for example, of the same size. The boundary surfaces formed by the end flank surface elements 42; 62 do not affect the light 102, 103, 105-107. There is, for example, no reflection or refraction of the light bundles 102, 103, 105-107. The light bundles 101-108 which pass through the beam splitter 135, are deflected in the deflection area 140, and exit at the light exit face 32; 52 are at the same distance from one another and have the same cross section. They have in this embodiment example the same direction 9 as the light 101-108 emitted by the light source 10. The gaps 111 do not appear and are not visible to the observer. The light exiting from that in FIGS. 1 and 2 is equally divided over the surface. On observation from a suitable distance the impression of a uniformly distributed luminance is produced.

In an alternative embodiment of the light distributors 30; 50 according to one of the FIG. 6 or 7, the gap 111 is also bridged in the light-deflecting area 140 so that a uniform luminance distribution results. In an embodiment according to FIG. 6, for example, the light-deflecting area 143 is formed by a large step surface element 241 while the light-deflecting surfaces 142, 145-147 are formed by small step surface elements 240. Whereas in FIG. 7, all the light-deflecting surfaces 142, 143, 145-147 are parts of the boundary surfaces which are formed by large step surface elements 341.

The size of the light-deflecting surfaces 142, 143, 145-147 may increase with increasing distance from the beam splitter 135. Some midlines of the light-deflecting surfaces 142, 143, 145-147, specifically those projected opposite to the direction of the light 101-108 exiting from the light exit surfaces 32; 52, are then at the same distance from one another. In large light distributors 30; 50, it is thus possible to compensate the attenuation of the light intensity due to material absorption so that light emission from the light guide assembly 5 will appear substantially uniform across the entire light exit surface 73.

The light-deflecting surfaces 142, 143, 145-147 thus projected and the light passage surfaces 138 can also be of different sizes. Thus, e.g. in a light-emitting diode 10, areas of different light intensity can be equalized. For example, areas of greater light intensity can illuminate small light-deflecting surfaces 142, 143, 145-147 and light passage surfaces 138 while areas of low light intensity illuminate large surfaces 138, 142, 143, 145-147.

The beam splitter 135 and the light-deflecting surfaces 142, 143, 145-147 can be parts of different elements. For example, the light-reflecting surfaces 137 of the beam splitter 135 around the light-deflecting surfaces 142, 143, 145-147 can be mirror surfaces of individual mirrors, which may or may not be adjustable.

Figure 9:
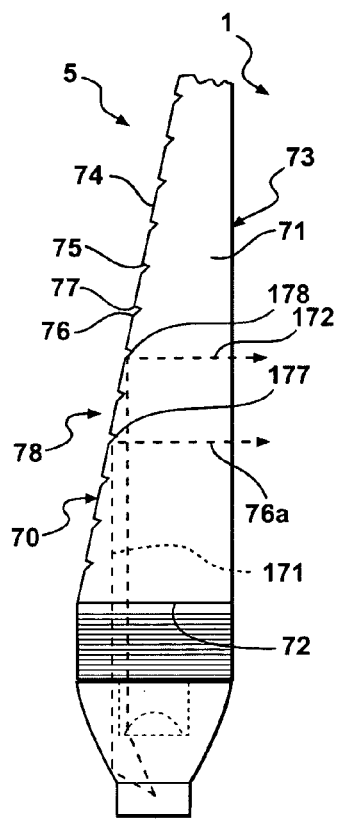
FIG. 9 is a side view of a light guide assembly unit with a surface light guide.
Figure 10:
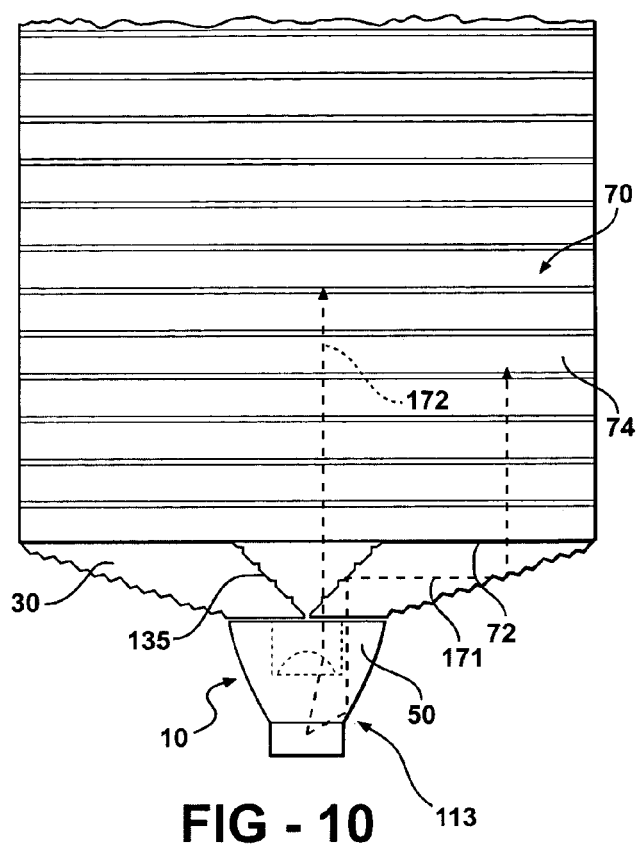
FIG. 10 is a rear view of a light guide assembly according to FIG. 9.

FIGS. 9 and 10 show a front view and a side view of the light guide assembly 5 with a surface light guide, generally shown at 70. The light source 10 and the light distributor 30; 50 described in FIGS. 1 and 2 are used as components thereof.

The surface light guide 70 represented in FIGS. 9 and 10 has the structure of a regular three-sided prism having a base surface 71 and a top surface that are parallel and congruent right-angled triangles. It may be a transparent plastic element similar to or of the same material as the light-deflecting element 13 and/or the light distributor 30; 50. A lower side 72 of the surface light guide 70 is, for example, a right-angled plane surface, which lies directly on and covers the light exit surfaces 32; 52 of the light distributor 30; 50.

Perpendicular to this surface 72 and embodied in these Figures as a plane surface, is a front side surface, generally shown at 73, of the surface light guide 70. The height of the front side surface 73 of the surface light guide 70, here shown shortened, is, for example, 80% larger than its length parallel to the light distributors 30; 50. The front side surface 73, which is the light exit surface 73 of the surface light guide 70, is in this embodiment example 25 times as large as the total of the light exit surfaces 16, 19 of the light source 10. The light exit surface 73 can also be more than 200 times as large as the total of the light exit surfaces 16, 19.

A rear side surface 74 of the surface light guide 70 has horizontal triangular notches 75. The length of the individual notches 75 is equal to the length of the surface light guide 70. These notches 75 are disposed in such a manner that they form a series of steps at a constant distance from one another. The distance between the individual notches 75 is, for example, twice as large as the width of the individual notches 75. In the embodiment shown, the width of the notches is between 0.5 mm and 1 mm. The two notch surfaces 76, 77 are, in the representation of FIGS. 9 and 10, plane surfaces. A normal 76a to the lower notch surface 76 makes with an imaginary line which is generally parallel to the lower side 72, for example, an angle which is greater than or equal to the critical angle of total reflection for the material of the surface light guide 70 against air 1.

On the rear side 78 of the surface light guide 70 an additional light source, not represented here, can be disposed. The direction of the light emitted by this light source is then, for example, at least approximately normal to the light exit surface 73 of the surface light guide 70.

During the operation of the light guide assembly 5 the light 101-108 emitted by the light source 10 is divided in the light distributors 30; 50 as described in connection with FIGS. 1-7. In the individual light bundles 101-108 parallel to one another, the luminous flux is largely equal.

The light bundles 101-108 enter into the surface light guide 70 through its lower side 72. In the surface light guide 70, the light bundles 101-108 strike boundary surfaces which are formed by the notch surfaces 76. In FIGS. 9 and 10, for example, two possible light paths 171, 172 are represented. These light paths 171, 172, which are each partial light bundles of the light bundles 101-108, each illuminate a part of the boundary surface formed by the notch surfaces 76. The illuminated surfaces are light-reflecting surfaces 176-178. The part of the luminous flux 101-108 which, for example, is tangential to the light-reflecting surface 176, therefore in the representation in FIG. 9 passing by to the right of the light-reflecting surface 176, strikes the next further removed light-reflecting surface 177.

The partial luminous fluxes 171-172 striking these light-reflecting surfaces 176-178 are, for example, completely deflected in the direction of the front side 73 and pass through this light exit surface 73 into the environment 1. An observer sees from, a distance of approximately two to three meters, the homogeneously shining front side 73 of the surface light guide 70 with a uniform luminance distribution.

If in addition the light source disposed on the rear side 78 of the surface light guide 70 is switched on, the light emitted by this light source penetrates the surface light guide 70 substantially unhindered. The observer can recognize this additional light source clearly. Depending on the luminance of the light source 10 and the additional light source, either the total luminance is increased or only one light source is perceived when they are operating simultaneously. In other alternative embodiments, several light sources can also be disposed on the rear side 78 of the surface light guide 70.

The surface light guide 70 can be arched. Thus, the front side 73 of the surface light guide 70 can form, for example, the outer contour of a vehicle. Also, the light distributors 30; 50 of a light guide assembly 5 of this type can have a structure adapted to a vehicle contour.

Figure 11:
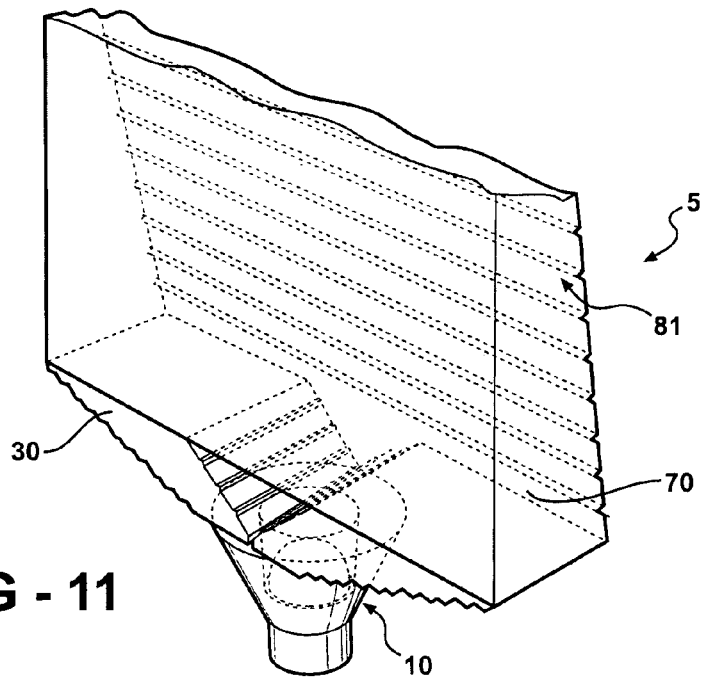
FIG. 11 is a perspective view of the invention unit with deflection structures according to FIG. 8.

FIG. 11 shows a light guide assembly 5 with a surface light guide 70 whose reflecting surfaces 176-178 comprise optical structures 81. These optical structures 81 are, for example, a plurality of ellipsoidal extracts 82 arched toward the environment 1.

Figure 8:
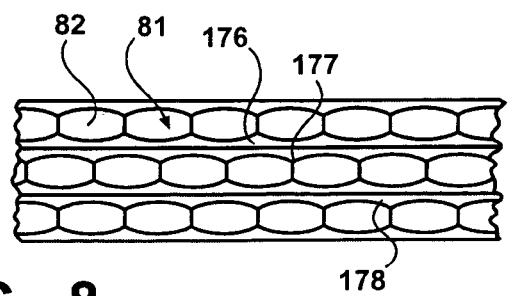
FIG. 8 is a detailed side view of optical deflection structures.

Referring to FIG. 8, an extract of these optical structures 81 is observed from the lower side 72 of a transparent surface light guide 70. The longitudinal axis of the individual imaginary ellipsoids is in this case parallel to the lower side 72 and parallel to the front side 73 of the surface light guide 70. Here the reflecting surfaces 176-178 disposed one behind another for the striking light bundles 101-108 are represented one above another. The ellipsoidal extracts 82 disposed on the individual reflecting surfaces 176-178 are disposed so as to be offset with respect to one another.

The light bundles 101-108 striking the reflecting surfaces 176-178 are reflected on the optical structures 81. The reflected light is distributed in space so that a solid-angle field of $\pm 20°$ in the horizontal direction and $\pm 10°$ in the vertical direction is illuminated.

Figure 12:
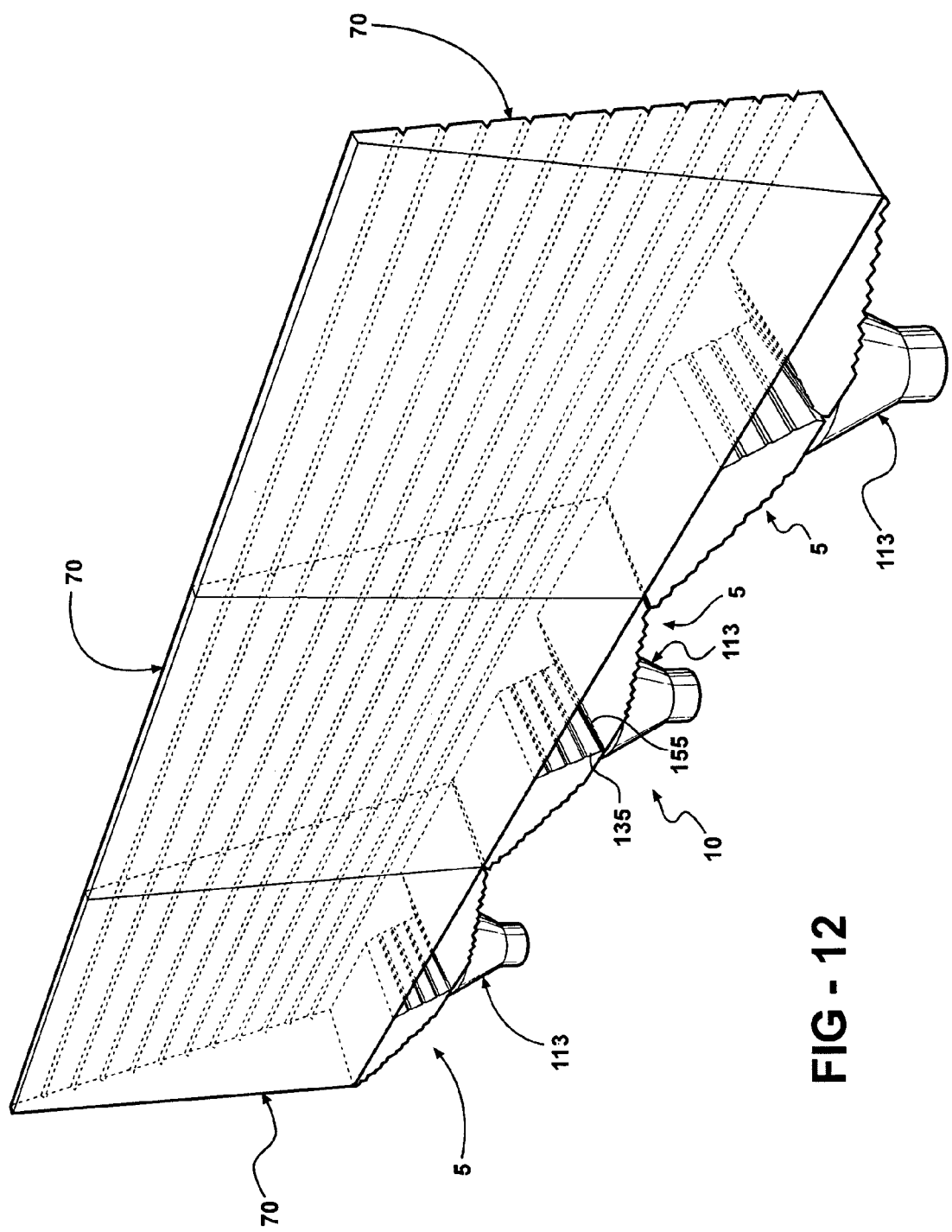
FIG. 12 is a perspective view of an alternative embodiment of the invention having with three light guide assembly units.

In FIG. 12, an arrangement of three light guide assemblies 5 is represented. They are disposed next to one another where the face surfaces of the surface light guide 70 border one another. With this arrangement, a large-surface illumination can be produced. It should be appreciated by those skilled in the art that one light source or several light sources can be disposed on the rear side 78 of the surface light guide 70.

The light-emitting units 5 represented in FIGS. 1, 2, and 9 through 12 can be embodied as a single part. Thus, the entire light guide assembly 5 can form one injection-molded part into which the light source 10 is formed or onto which the light source 10 is formed. The light source 10, which can, in addition to a light-emitting diode, be an incandescent lamp, a halogen lamp, and the like, can also be clipped onto the light distributor(s) 30; 50 or connected to it in some other manner.

The optical element 113 which collimates the light 101-108 emitted by the light source 10 can also be part of a light distributor, or the light distributors, 30; 50. The light 101-108 striking the light distributor 135 can, for example, also be collimated by means of an optical lens, an, e.g. parabolic, reflector, and so on.

With the light source 10 switched off, the light guide assembly 5 appears clearly and unstructured. If the light source 10 is switched on, a uniformly shining surface without faults appears to the position of the observer.

The light guide assembly 5 is compactly structured and can thus, for example, be used as part of a combined rear light unit in a motor vehicle. For example, it can comprise a tail light with blinkers and/or brake light disposed behind it.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

The invention claimed is:

1. A light guide assembly (5) comprising:
a base (14);
a light source (10) removably secured to said base (14) and oriented to emit light (101-108) out and away from said base (14);
a light distributor (50) spaced apart from said light source for distributing the light (101-109) across said light guide assembly, said light distributor (50) including a primary reflection surface (55) with a plurality of transmission elements (58) extending out from said primary reflection surface (55) therealong to allow a portion of the light (101, 104, 108) to pass through said transmission elements (58) of said primary reflection surface (55) without being reflected by said primary reflection surface;

a collimator (113) disposed between said light source (10) and said light distributor (50) to collimate the light (101-108) before it impinges on said light distributor (50);

a plurality of light deflecting surfaces (142, 143, 145-147) complementing said primary reflection surface (55) to deflect the light (102, 103, 105-107) reflected by said primary reflection surface (55) out of said light guide assembly (5), each of said plurality of light deflecting surfaces (142, 143, 145-147) defining a width, wherein said width of each of said plurality of light deflecting surfaces (142, 143, 145-147) is relative to said distance to said primary reflection surface (55); and said light distributor (50) including a light entry surface (51) to receive the light (101-108) after it is collimated by said collimator (113).

2. A light guide assembly (5) as set forth in claim 1 wherein said light distributor (50) includes a light exit surface (52) from which a remainder of the light (101-108) is emitted.

3. A light guide assembly (5) as set forth in claim 2 including a surface light guide (70) for receiving the light emitted by said light distributor (50).

4. A light guide assembly (5) as set forth in claim 3 wherein said surface light guide (70) includes a plurality of notches (75) having notch surfaces (76, 77).

5. A light guide assembly (5) as set forth in claim 4 including optical structures (81) for dispersing the light (101-108).

6. A light guide assembly (5) as set forth in claim 5 wherein said surface light guide includes a front side (73) allowing the light (101-108) to pass therethrough.

* * * * *